US011262395B2

(12) United States Patent
Szczeszynski et al.

(10) Patent No.: US 11,262,395 B2
(45) Date of Patent: Mar. 1, 2022

(54) TESTING SWITCHES IN A POWER CONVERTER

(71) Applicant: pSemi Corporation, San Diego, CA (US)

(72) Inventors: Gregory Szczeszynski, Hollis, NH (US); Brian Zanchi, Dracut, MA (US)

(73) Assignee: pSemi Corporation, San Diego, CA (US)

( * ) Notice: Subject to any disclaimer, the term of this patent is extended or adjusted under 35 U.S.C. 154(b) by 299 days.

(21) Appl. No.: 16/023,163

(22) Filed: Jun. 29, 2018

(65) Prior Publication Data

US 2020/0003823 A1 Jan. 2, 2020

(51) Int. Cl.
*G01R 31/26* (2020.01)
*H02M 3/07* (2006.01)
*G01R 31/40* (2020.01)
*H02M 1/08* (2006.01)
*H02M 1/00* (2006.01)

(52) U.S. Cl.
CPC ......... *G01R 31/2621* (2013.01); *G01R 31/40* (2013.01); *H02M 1/08* (2013.01); *H02M 3/07* (2013.01); *H02M 1/0009* (2021.05)

(58) Field of Classification Search
None
See application file for complete search history.

(56) References Cited

U.S. PATENT DOCUMENTS

| | | | | |
|---|---|---|---|---|
| 2008/0007241 A1* | 1/2008 | Isham | ...................... | H02M 1/08 323/285 |
| 2009/0200965 A1* | 8/2009 | King | ..................... | H05B 41/282 315/307 |
| 2013/0229841 A1* | 9/2013 | Giuliano | ................. | H02M 3/07 363/60 |
| 2014/0184173 A1* | 7/2014 | Szepesi | ................. | H02J 7/0068 320/164 |

\* cited by examiner

*Primary Examiner* — Nasima Monsur
(74) *Attorney, Agent, or Firm* — Finnegan, Henderson, Farabow, Garrett & Dunner, LLP

(57) ABSTRACT

A switching network includes a switch, a driver for the switch, and a floating-regulator that powers the driver. The floating-regulator includes a shunt that is used only when testing the network. The shunt diverts biasing current so that it does not interfere with a measurement of an electrical property of a switch.

10 Claims, 10 Drawing Sheets

TESTING SWITCHES IN A POWER CONVERTER

FIELD OF INVENTION

This invention relates to testing of an integrated circuit, and in particular, to testing switches for a switched-capacitor circuit.

BACKGROUND

A power converter often includes a switched-capacitor circuit that converts one voltage into another voltage. The switched-capacitor circuit generally includes a switching network having one or more switches that are used to interconnect various capacitors. When these switches are closed, they handle significant amounts of current.

The switches are typically implemented as field-effect transistors. A voltage that is applied to a gate terminal of the transistor closes this switch. This voltage controls the existence of a conducting channel between the transistor's source and drain terminals. Like any conducting channel, this channel will have some resistance to current flow. Because this channel is between the transistor's drain and source, and because it is established in the transistor's "ON" state, this resistance is often called the "RDSON" of the transistor.

The value of RDSON is of great significance. This is particularly so when the switch is called upon to handle significant amounts of current. It is therefore important that the channel's resistance conform to the design specification.

Another parameter of interest is the transistor's leakage current. Even when no conducting channel connects the source and drain across the gate, it is still possible for a few charge carriers to diffuse from the source all the way to the drain. This results in a small leakage current.

Both the transistor's RDSON and its leakage current are subject to variability as a result of imperfections in the manufacturing process. Thus, it is important to measure both RDSON and leakage current as a part of the manufacturing process. Doing so provides the opportunity to reject defective switches and to thereby avoid the likelihood of placing a faulty power converter into the stream of commerce.

SUMMARY

In one aspect, the invention features an apparatus that includes a switching network. The switching network includes switches, drivers for those switches, and floating-regulators that power the drivers. Each floating-regulator includes a shunt that is used only when testing the network. The shunt diverts biasing current so that it does not interfere with a measurement of an electrical property of a switch.

In another aspect, the invention features a switching network that, when connected to capacitors, forms a switched-capacitor network for transforming a first voltage into a second voltage. The switching network includes a plurality of switches, a corresponding plurality of drivers, and a corresponding plurality of floating-regulators. Among these are first and second switches, a first driver, and a first floating-regulator that has first and second current paths, together with a shunt for selecting between them. Current that proceeds along the first current path is provided to a second floating-regulator to provide power for driving the second switch. However, current that proceeds along the second path is diverted. As a result, this current fails to provide power for driving any switch.

Some embodiments include a controller that causes the shunt to select the second path.

In other embodiments, during operation, the switching network comprises a node of lower electrical potential. This node has an electrical potential that is lower than all other electric potentials in the switching network. In such embodiments, the second path leads to this node of lower electrical potential. In other embodiments, this node of lower electrical potential is the node of lowest electrical potential.

Yet other embodiments include a controller configured to determine whether a switch in the switching network has an electrical parameter that complies with a design specification. Such a controller causes a bias current in the switch and diverts the bias current so that it avoids interfering with measurement of the electrical parameter. Such a controller also applies an electrical stimulus, measures an electrical response, derives the electrical parameter from the electrical response, and determines that the electrical parameter falls outside of the design specification and identifies the switching network as being defective.

Also among the embodiments are those that include a controller configured to measure an extent to which a switch conducts electric current when the switch is held in a conducting state. Such a controller causes a bias current to hold the switch in the conducting state, diverts the bias current so that the bias current avoids interfering with a known current that is injected through the switch, causes injection of the known current through the switch, measures a voltage across the switch, and determines the extent to which the switch conducts based on the measurement of the voltage and the known current.

Yet other embodiments include a controller configured to determine whether a switch in the switching network has an electrical parameter that complies with a design specification. In such embodiments, the controller causes a bias current in the switch, diverts the bias current so that the bias current avoids interfering with measurement of the electrical parameter, measures the electrical parameter, determines that the electrical parameter falls outside of the design specification, and identifies the switching network as being defective.

Still other embodiments include a controller configured to determine a leakage current of a switch in the switching network. Such a controller causes a bias current to bias the switch to be in a non-conducting state and diverts the bias current so that the bias current avoids interfering with measurement of the leakage current.

Other embodiments include a power converter. In these embodiments, the switching network and capacitors define a switched-capacitor network that is a constituent element of the power converter. Among these embodiments are those that also include a controller that controls the switches. Also among these embodiments are those in which the shunt never switches between the first and second paths.

In other embodiments, the plurality of switches comprises a first set of switches that are arranged in series to define a first charge-transfer path that extends from the switching network's input to its output. This first charge-transfer path comprises nodes at which switches from the first set of switches connect. These nodes are also configured to be connected to the capacitors.

In other embodiments, the plurality of switches comprises first and second sets of switches. Switches from the first set are arranged in series to define a first charge-transfer path and switches from the second set are likewise arranged in series to define a second charge-transfer path. Both charge-transfer paths extend from the switching network's input to its output. The first charge-transfer path comprises nodes at which switches from the first set of switches connect to each other. These nodes are configured to be connected to a first plurality of capacitors. Meanwhile, the second charge-transfer path comprises nodes at which switches from the second set of switches connect to each other. These nodes are configured to be connected to a second plurality of capacitors.

Some embodiments also include a monolithic substrate into which the switching circuit is integrated.

Alternative embodiments have first and second monolithic substrates. In these embodiments, the switching circuit is integrated into the first monolithic substrate and the capacitors are integrated into the second monolithic substrate. The first and second monolithic substrates are interconnected so that the switching circuit is electrically connected to the capacitors.

Some embodiments include a monolithic substrate and a plurality of capacitors. In these embodiments, the switching circuit is integrated into the monolithic substrate and the capacitors are connected to the switching circuit.

Other embodiments include those in which the switches comprise power FETs.

In yet other embodiments, each switch has multiple parallel paths between its drain and its source, with each such path being individually controlled.

Additional embodiments include those in which the switches are distributed between first and second charge-transfer paths that both extend between an input and an output of the switching network. In these embodiments, the floating-regulators are cross-coupled between the first and second charge-transfer paths.

Still other embodiments are those in which the first floating-regulator comprises a regulator switch to regulate flow of charge into the first driver and a Zener diode that causes the flow of charge to be provided at a fixed offset from a floating voltage.

Additional embodiments include those in which the floating-regulator comprises a regulator switch to regulate flow of charge into the first driver and conducting paths for supplying currents to the regulator switch. These conducting paths extend between different sources of charge and the regulator switch.

Also among the embodiments are those in which the first floating-regulator comprises a regulator switch and diodes that connect the regulator switch to corresponding sources of electric charge.

In another embodiment, the first floating-regulator includes a regulator switch to regulate flow of charge into the first driver and a Zener diode. The Zener diode causes the flow of charge to be provided at a fixed offset from a floating voltage.

Also among the embodiments are those in which the first floating-regulator includes a regulator switch to regulate flow of charge into the first driver and a plurality of conducting paths for supplying currents to the regulator switch. These the conducting paths extend between different sources of charge and the regulator switch. Examples of different sources of charge include different capacitors to which the switching network is connected and also an external power supply that is outside the switched-capacitor network altogether.

In some embodiments, the first floating-regulator includes a regulator switch and first and second diodes. The diodes connect the regulator switch to different sources of charge.

In yet other embodiments, the first floating-regulator includes a device that permits to current flow unless the potential imposed across its terminals is of a first polarity and has a magnitude less than a threshold. Such embodiments feature a regulator switch that regulates current into a first driver and also into the device.

In another aspect, the invention features a method comprising testing an electrical parameter of a switch in a switching network in an integrated circuit, that, when connected to capacitors, forms a switched-capacitor network for transforming a first voltage into a second voltage, the switching network having a plurality of switches, a corresponding plurality of drivers, and a corresponding plurality of floating-regulators. In such a method, testing the electrical parameter comprises causing a first current, at least some of which will be used to bias the switch, diverting the current along a path such that the current avoids interference with a measurement, and carrying out the measurement.

In some practices, the method includes, after having diverted the current, measuring a leakage current of the switch.

In other practices, the method includes, measuring an RDSON of the switch.

Other practices further include providing a stimulus to the switch, measuring a response to the stimulus, and based on the response, determining the electrical parameter.

In another aspect, the invention includes testing a leakage current of a first switch in a switching network in an integrated circuit, that, when connected to capacitors, forms a switched-capacitor network for transforming a first voltage into a second voltage. The switching network includes a plurality of switches, one of which is the first switch. It also includes a corresponding plurality of drivers, and a corresponding plurality of floating-regulators. Testing the leakage current includes causing a first current, at least some of which will be used to bias the first switch, diverting it along a path such that it avoids interference with a measurement of a second current, measuring the second current, and determining the leakage current at least in part based on the measurement of the second current.

In some practices, the method comprises connecting an external voltage source across the switch. Such an external voltage source is external to the switched-capacitor network. As such, it excludes the capacitors of the switched-capacitor network itself. The second current is current that enters the switching network.

Additional practices include suppressing the ability of the second current from flowing along a path other than a charge-transfer path that leads to the first switch.

In those practices in which the first switch is in series with a second switch on the charge-transfer path, the method also includes suppressing the current that enters the switching network from flowing along the charge-transfer path towards the second switch.

In yet other practices, one of the floating-regulators controls driving of the first switch. Among these practices are those in which the first current is one that flows through this floating-regulator.

Further practices are those in which the first current carries power and wherein diverting the first current includes wasting this power.

In those cases in which the switches are in series along a charge-transfer path, there exists practices of the invention in which diverting the first current includes causing the first current to avoid flowing along the charge-transfer path.

In another aspect, the invention features an apparatus comprising a switching network. The switching network, when connected to capacitors, forms a switched-capacitor network for transforming a first voltage into a second voltage. The switching network includes a plurality of switches, a corresponding plurality of drivers, and a corresponding plurality of floating-regulators. Among the switches is a first switch that connects to a floating voltage. Among the drivers is a first driver to drive the first switch using a drive voltage. A first floating-regulator from among the regulators relies on voltage provided by an external voltage source for causing the drive voltage to be at a fixed offset from the floating voltage. This external voltage source is one that is external to the switched-capacitor circuit. As such, it is not one of the capacitors that forms the switched-capacitor network.

In some embodiments, the first floating-regulator includes a first output and a second output. The first output is maintained at a voltage that depends on the floating voltage; the second output is maintained at a voltage that depends on the offset. In such embodiments, first driver is connected between the first and second outputs.

Also among the embodiments are those in which first floating-regulator includes a first path that connects a voltage provided by the external voltage source to the first driver and a second path that connects a voltage corresponding to the offset to the first driver. In some of these embodiments, the first path includes a regulator switch and the second path includes a Zener diode.

In some aspects, the invention features determining RDSON values for each switch from a plurality of switches that, together with a plurality of drivers that drives the switches and a plurality of floating-regulators for controlling the drivers, forms a switching network. The switching network, when connected to capacitors, forms a switched-capacitor network for transforming a first voltage into a second voltage. The switches are disposed in series along a charge-transfer path. Among the switches are first and second switches that connect to corresponding first and second floating voltages. Determining RDSON values comprises causing a known current to flow through the charge-transfer path and concurrently determining RDSON values for each of the first and second switches.

Some practices of the method include measuring a first voltage across the first switch, measuring a second voltage across the second switch, and based on the first and second voltages, determining RDSON values for the first and second switches.

Also among the practices of the invention are those in which causing a known current to flow through the charge-transfer path includes inhibiting opportunities for the current to stray from the charge-transfer path.

In another aspect, the invention features a switching network that, when it is connected to capacitors, forms a switched-capacitor network for transforming a first voltage into a second voltage. The switching network includes a floating-regulator that has two terminals. One terminal receives charge from one of the capacitors and the other terminal receives charge from another one of the capacitors. The floating-regulator uses charge from one of the two capacitors to cause a driver to drive a switch from the switched-capacitor network such that a driving voltage for the switch is equal to a fixed offset from a floating voltage that is present on one of the switch's terminals.

In another aspect, the invention includes a switching network that, when connected to capacitors, forms a switched-capacitor network for transforming a first voltage into a second voltage. Such a switching network includes a switch, a driver, and a floating-regulator. The floating-regulator includes a first current path and a second current path. Current that proceeds along the first current path drives the switch; current that proceeds along the second path is diverted such that it fails to provide power for driving any switch. The floating-regulator includes a shunt for causing the current to proceed along one of the first and second paths.

Some embodiments include a controller. In some of these embodiments, the controller causes the shunt to select the second path. In others, the controller determines whether a switch in the switching network has a leakage current that complies with a design specification. In these cases, the controller causes a bias current in the switch, causes a diversion of this bias current so that the bias current avoids interfering with measurement of the leakage current, applies a voltage across the switch, obtains a measurement of a current that flows in response to application of the voltage, derives the leakage current from the measurement, determines that the leakage current falls outside of the design specification, and identifies the switching network as being defective. In still others of these embodiments, the controller estimates a switch's leakage current in part by causing a bias current that biases the switch to be in a non-conducting state and diverting the bias current so that it avoids interfering with measurement of the leakage current.

In other embodiments, the second path leads to a node of lowest electrical potential. This node has an electrical potential that is lower than all other electric potentials in the switching network.

Also among the embodiments are those that include a power converter. Among these embodiments are those in which the switching network and the capacitors define a switched-capacitor network that is a constituent of the power converter. The power converter includes a controller for controlling the switching network.

Also among the embodiments that include a power converter are those in which the switching network and the capacitors define a switched-capacitor network that is a constituent of the power converter. During operation of the power converter, the shunt never switches between the first and second paths.

In some embodiments, the switching network includes first and second sets of switches. The switches from the first set are arranged in series to define a first charge-transfer path that extends from the switching network's input to its output. Meanwhile, the switches from the second set of switches are arranged in series to define a second charge-transfer path that also extends from between the input and output. The first charge-transfer path includes nodes at which switches from the first set of switches connect to each other. These nodes connect to a first set of capacitors. The second charge-transfer path likewise includes nodes at which switches from the second set of switches connect to each other. These nodes connect to a second set of capacitors.

Also among the embodiments are those in which the switching circuit is integrated into a monolithic substrate.

It is not necessary to have only one such substrate. In other embodiments, the switching circuit is integrated into a first monolithic substrate and the capacitors are integrated into a second monolithic substrate that is interconnected with the first monolithic substrate.

In other embodiments, the capacitors are not integrated into a substrate. In these embodiments, the switching circuit is integrated into the monolithic substrate and the capacitors are connected to the switching circuit without having to be on a monolithic substrate.

Embodiments further include those in which the switch is a power FET and those in which the switch is one of several switches that are distributed between first and second charge-transfer paths. Both of these charge-transfer paths extend between an input and an output of the switching network. In such embodiments, the floating-regulator is cross-coupled between the first and second charge-transfer paths.

Also among the embodiments are those in which the floating-regulator includes a regulator switch to regulate flow of charge into the driver and a Zener diode. The Zener diode causes the flow of charge to be provided at a fixed offset from a floating voltage.

In yet other embodiments, the floating-regulator includes a regulator switch to regulate flow of charge into the driver and a plurality of conducting paths for supplying currents to the regulator switch. These conducting paths extend between different sources of charge and the regulator switch.

Further embodiments include those in which the floating-regulator includes a first diode that connects the regulator switch to a first source of charge and a second diode that connects a regulator switch to a second source of charge.

In still other embodiments, at least some of current that proceeds along the first current path and that drives the switch is provided to an additional floating-regulator to provide power for driving an additional switch.

In another aspect, the invention features a method that includes estimating a leakage current of a switch in a switching network in an integrated circuit. The switching network, when connected to capacitors, forms a switched-capacitor network for transforming a first voltage into a second voltage. It includes a driver and a floating-regulator. Estimating the leakage current includes causing a first current, at least some of which will be used to bias the switch, diverting the first current along a path such that the first current avoids interference with a measurement of a second current, obtaining a measurement of the second current, and determining, the leakage current based at least in part based on the measurement of the second current.

In some practices, the switch is one of a plurality of switches that are in series along a charge-transfer path. In these practices, diverting the first current includes causing the first current to avoid flowing along the charge-transfer path.

Alternative practices of the invention include connecting a voltage source across the switch. The voltage source is one that is external to the switched-capacitor network. This means that it is not one of the capacitors in the switched-capacitor network. The second current is current that enters the switching network.

Yet other practices of include suppressing the ability of the second current from flowing along a path other than a charge-transfer path that leads to the switch.

In those cases in which the switch is a first switch that is in series with a second switch along a charge-transfer path, there are practices of the method that also include suppressing the current that enters the switching network from flowing along the charge-transfer path towards the second switch.

Additional practices include causing the first current to flow through the floating-regulator, which controls driving of the switch.

Also among the practices of the invention are those that include wasting power by diverting the first current.

In another aspect, the invention features a switching network that, when connected to capacitors, forms a switched-capacitor network for transforming a first voltage into a second voltage. The switching network includes a switch that connects to a floating voltage, a driver configured to drive the switch using a drive voltage, and a floating-regulator that relies on a voltage provided by voltage source for causing the drive voltage to be at a fixed offset from the floating voltage. This voltage source is one that is external to the switched-capacitor circuit. As such, it does not include a capacitor from the switched-capacitor circuit.

Among the embodiments are those in which the floating-regulator includes first and second outputs. The first output is maintained at a voltage that depends on the floating voltage and the second output is maintained at a voltage that depends on the offset. The driver is connected between the first and second outputs.

Also among the embodiments are those in which the floating-regulator includes a first path that connects a voltage provided by the external voltage source to the driver and a second path that connects a voltage corresponding to the offset to the driver.

In some embodiments, the floating-regulator includes a regulator switch disposed along a first path and a Zener diode disposed along a second path. The first path connects to a voltage provided by a voltage source that is external voltage to the driver and the second path connects to a voltage corresponding to the offset to the driver.

Other embodiments include a controller configured to cause a bias current to hold the switch in a conducting state and to divert the bias current so that it avoids interfering with a known current that is injected through the switch. The controller also causes injection of the known current through the switch, measures a voltage across the switch, and estimates an RDSON of the switch based on the measurement of the voltage and the known current.

In still other embodiments, the switch is one of a plurality of switches that are arranged in series to define a first charge-transfer path that extends from an input of the switching network to an output of the switching network. The first charge-transfer path includes nodes at which switches from the first set of switches connect. These nodes are configured to be connected to the capacitors.

In another aspect, the invention includes estimating an RDSON value for a switch that, along with a driver that drives the switch and a floating-regulator for controlling the driver, is a constituent of a switching network that when connected to capacitors, forms a switched-capacitor network for transforming a first voltage into a second voltage. The switch is disposed along a charge-transfer path and connects to a floating voltage. Estimating RDSON values includes causing a known current to flow through the charge-transfer path and estimating an RDSON value for the switch.

In some practices, the switch is one of a plurality of switches in series along the charge-transfer path and the method includes concurrently obtaining voltage measurements across each of the switches and estimating the RDSON values based on the voltage measurements.

Other practices include causing a known current to flow through the charge-transfer path includes inhibiting opportunities for the current to stray from the charge-transfer path.

BRIEF DESCRIPTION OF THE DRAWINGS

These and other features of the invention will be apparent from the following description and the accompanying figures, in which.

DETAILED DESCRIPTION

Figure 1:
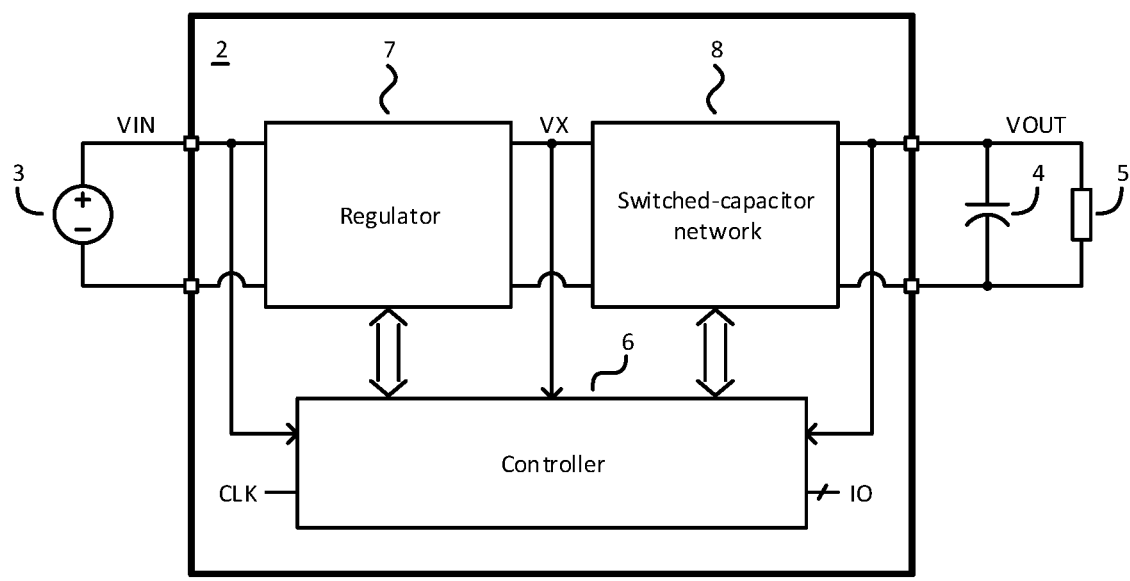
FIG. 1 shows a power converter that incorporates a switched-capacitor network.

FIG. 1 shows a power converter 2 for receiving an input voltage VIN provided by a voltage source 3 and transforming it into an output voltage VOUT that is made available at an output capacitor 4 and a load 5 thereof. The power converter 2 includes a controller 6 that controls a regulator 7 and a switched-capacitor network 8. As used herein, the term a "switched-capacitor network" includes a charge pump.

In the illustrated embodiment, the regulator 7 connects the voltage source 3 to the switched-capacitor network 8. However, it is also possible for the regulator 7 to connect the switched-capacitor network 8 to the output capacitor 4. The power converter 2 as shown can therefore be viewed as a specific embodiment of a more general power converter that comprises a first element connected to a second element, wherein when the first element is a regulator, the second element is a switched-capacitor network and wherein when the first element is a switched-capacitor network, the second element is a regulator.

In some cases, the regulator 7 is implemented as a switched inductor circuit, examples of which include a buck converter, a boost converter, and a buck-boost converter. Such a switched-inductor circuit can be operated with a duty cycle equal to zero, thus transforming it into a magnetic filter. As such, in some embodiments, the regulator 7 is simply a magnetic filter, such as an inductor.

In other cases, it is possible to obtain adequate performance with no regulator. Thus, embodiments of the power converter 2 also include those with just the switched-capacitor network 8.

Power converters of the type shown in FIG. 1 are described in detail in U.S. Pat. Nos. 8,860,396, 8,743,553, 8,723,491, 8,503,203, 8,693,224, 8,724,353, 8,619,445, 9,203,299, 9,742,266, 9,041,459, U.S. Publication No. 2017/0085172, U.S. Pat. Nos. 9,887,622, 9,882,471, PCT Publication No. WO2017161368, PCT Publication No. WO2017/091696, PCT Publication No. WO2017/143044, PCT Publication No. WO2017/160821, PCT Publication No. WO2017/156532, PCT Publication No. WO2017/196826, and U.S. Publication No. 2017/0244318, the contents of which are all incorporated herein by reference.

Figure 2:
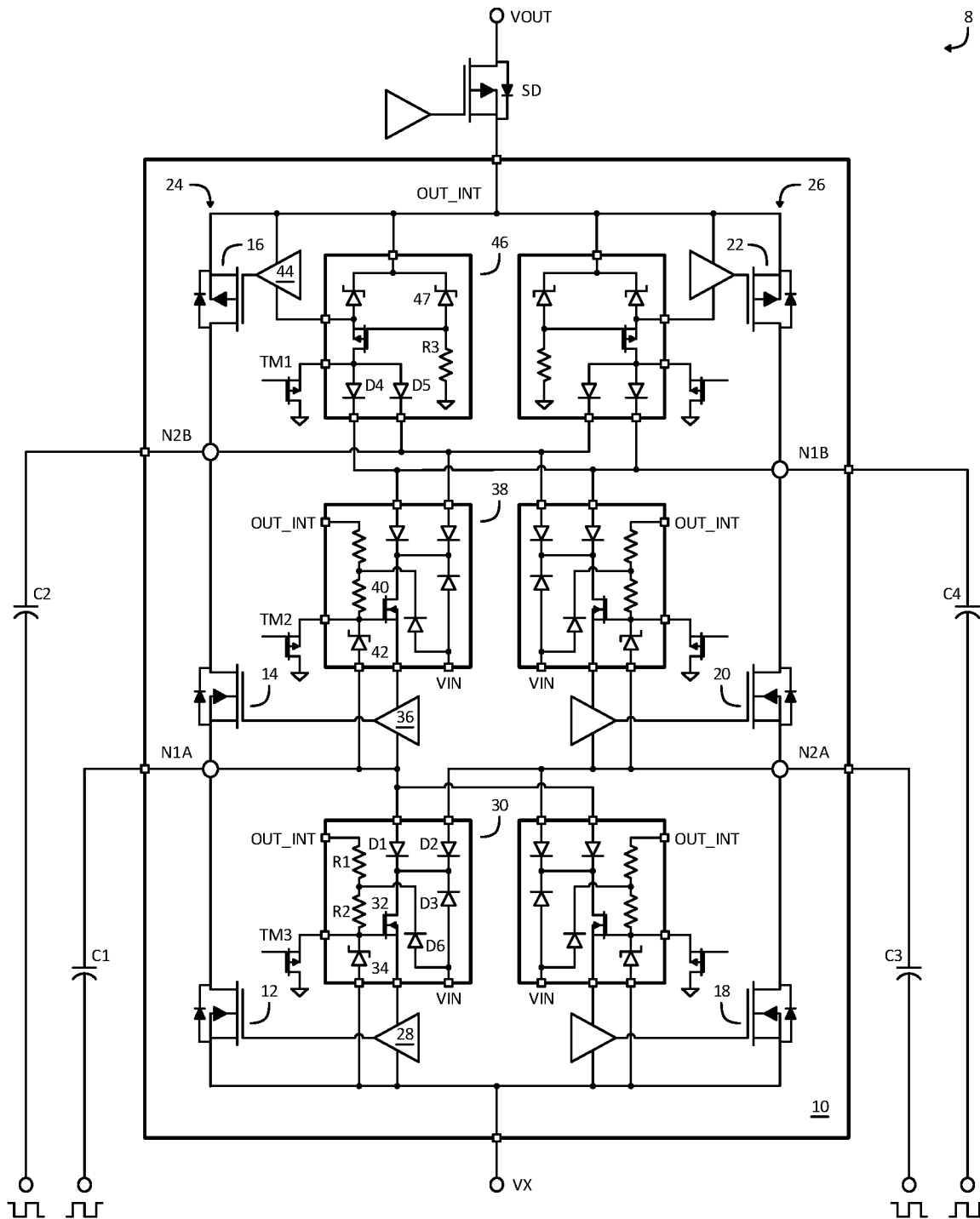
FIG. 2 shows details of the switched-capacitor network of the power converter shown in FIG. 1.

FIG. 2 shows the switched-capacitor network 8 in more detail. The switched-capacitor network 8 includes a switching circuit 10 that connects to first, second, third, and fourth capacitors C1, C2, C3, C4. The switching circuit 10 is typically integrated onto a monolithic substrate and connected, via pins, to the capacitors C1-C4 that are either on another monolithic substrate or that are provided as lumped elements.

The switching circuit 10 includes power FETS that implement a first switch 12, a second switch 14, a third switch 16, a fourth switch 18, a fifth switch 20, and a sixth switch 22. Each switch 12-22 has a current path that extends between its source and drain and a gate that opens and closes the current path. In the illustrated embodiment, the third switch 16 and the sixth switch 22 are implemented as PMOS transistors and the remaining switches are implemented as NMOS transistors.

The first and second switches 12, 14 connect at a first node N1A. The second and third switches 14, 16 connect at a second node N2B. The fourth switch 18 connects to the fifth switch 20 at a third node N2A. The fifth switch 20 connects to the sixth switch 22 at a fourth node N1B. Each of the nodes N1A, N1B, N2A, N2B connects to a corresponding one of the capacitors C1-C4.

The first, second, and third switches 12, 14, 16 together with the first and second nodes N1A, N2B define a first charge-transfer path 24 that extends between an input VX and an output node OUT_INT of the switched-capacitor network 8. The fourth, fifth, and sixth switches 18, 20, 22 and the third node N2A and the fourth node N1B define a second charge-transfer path 26 that likewise extends between the input VX and the output node OUT_INT. A disconnect switch SD selectively connects and disconnects the output node OUT_INT of the switching circuit 10 to any other component. In FIG. 1, the component is an output capacitor 4. However, in the testing procedure discussed below, that component can be a voltage source or a voltmeter.

To control the first switch 12, it is necessary to control the amount of charge on its gate. Accordingly, the first switch's gate connects to a first driver 28.

The first driver 28 functions as a switch that drives charge towards or away from the first switch's gate. To control the first switch 12 quickly, the amount of charge on its gate must change quickly. This requires that the first driver 28 provide a large current into or out of the first switch's gate.

The first driver 28 switches between a first state and a second state. In the first state, the first driver 28 receives charge from a first floating-regulator 30 and provides it to the first switch's gate. In the second state, the first floating-regulator 30 removes charge from the first switch's gate and disposes of it via the first charge-transfer path 24.

During normal operation, the charge that the first floating-regulator 30 ultimately provides to the first driver 28 when it is in the first state comes from either the capacitor connected to the first node N1A or the capacitor connected to the third node N2A. This is advantageous because it is not always possible to determine in advance which of these two capacitors will be able to provide charge to meet the floating-regulator's demand.

It is also possible to obtain charge from the voltage source 3 rather than from one of the two capacitors. This may occur during start-up or testing.

Charge that comes from the capacitor connected to the first node N1A reaches a first regulator switch 32 through a first diode D1, the anode of which connects to the first charge-transfer path 24. Charge that the capacitor connected to the third node N2A reaches the first regulator switch 32 through a second diode D2, the anode of which connects to the second charge-transfer path 26. Charge that comes from the voltage source 3 passes through the third diode D3, the anode of which connects to the voltage source 3. The cathodes of the first, second, and third diodes D1, D2, D3 connect to the first regulator switch 32. Which of these three sources of charge is ultimately used depends on which of the three anodes is at the highest voltage.

The first and second diodes D1, D2 provide cross-coupling between the first floating-regulator 30 and both the first and second charge-transfer paths 24, 26. The first regulator switch 32 regulates the flow of this charge into the first driver 28. Charge that ultimately reaches the first driver 28 during the first driver's first state ultimately passes through the first regulator switch 32.

As a result of the placement of the first and second diodes D1, D2, the first floating-regulator 30 ultimately receives charge during normal operation from either the capacitor connected to the third node N2A or from the capacitor connected to the first node N1A. This is advantageous since it is difficult to predict which of these capacitors will be able to provide charge to supply the first floating-regulator's demand for current.

In order to close the first switch 12, it is necessary to create a conducting path between its drain and source terminals. To do so, it is necessary to deposit enough charge on its gate to raise its gate voltage past its source voltage by an amount that is sufficient to form the conducting channel. Therefore, in addition to depositing charge quickly onto the gate, the first driver 28 must also deposit the correct amount of charge. If the first driver 28 fails to deposit enough charge, the conducting channel will be too small and hence excessively resistive. If the first driver 28 deposits too much charge, the first switch 12 can be damaged.

The correct amount of charge is one that raises the gate's voltage past the source's voltage by a particular amount. A difficulty that arises is that the source voltage floats. It is not fixed. This means that the correct gate voltage cannot be fixed. It must float with the source's voltage.

The first floating-regulator 30 achieves this by having a reference point that is offset above the source's floating voltage. In the illustrated embodiment, a Zener diode 34 creates this reference point.

The Zener diode 34, a first resistor R1, and a second resistor R2 together define a path that extends between the output node OUT_INT and the first switch's source. The voltage drop along this path is therefore the difference between the voltage at the output node OUT_INT and the floating source voltage.

The anode of a fourth diode D6 connects to the voltage source 3. Its cathode connects to the node at which the first and second resistors R1, R2 also connect. This is useful to avoid a potential short-circuit with the voltage source 3. The fourth diode D6 and the third diode D3 cooperate during testing to provide power to operate the first floating-regulator 30.

The Zener diode's anode connects to the first switch's source and its cathode connects to the second resistor R2. As such, the voltage at the Zener diode's cathode will always be a fixed offset above the first switch's source voltage. The remainder of the voltage drop, if any, between the source voltage and the output node OUT_INT is borne by the first and second resistors R1, R2.

The Zener diode 34 cannot itself carry significant current. However, it can be placed in parallel with a path that can carry a significant current. If this is done in such a way that the voltage drop across such a path crudely tracks the Zener diode, a voltage with the correct offset above the floating source voltage can be generated.

The Zener diode 34, in effect, functions as a voltage source that maintains a voltage that exceeds the floating source voltage by some fixed offset, the value of which depends on the VI characteristic of the Zener diode 34. This voltage, when made available to the gate of the first regulator switch 32, enables the first regulator switch 32 to provide a voltage to the first driver 28, when it is switched into its first state, suitable for forming a suitable conducting channel, thus closing the first switch 12.

A significant feature of the first floating-regulator 30 is the first-regulator shunt TM3. During normal operation of the switched-capacitor network 8, the switching circuit 10 connects to the capacitors C1, C2, C3, C4 and is actively engaged in converting one voltage into another. In this case, the first-regulator shunt TM3 is non-conducting. As a result, the current that biases the first regulator switch 32 passes into the first charge-transfer path 24.

However, shortly after being manufactured at a semiconductor fabrication facility, it is desirable to test the switching circuit 10. In particular, it is desirable confirm that the leakage currents and RDSON values for the various switches 12, 14, 16, 18, 20, 22 are within the design specifications. At some point during this testing, the first-regulator shunt TM3 will be made to conduct. As a result, the first-regulator shunt TM3 directs this same biasing current to ground instead of to the first charge-transfer path 24. This prevents the biasing current from mixing with whatever current is already on the first charge-transfer path 24. This also collapses the supply voltage to the first driver 28.

This testing is expected to be the only time in the lifetime of the switching circuit 10 that the first-regulator shunt TM3 will be made to conduct. The first-regulator shunt TM3 is therefore only used during testing.

The second switch 14 likewise has an associated second driver 36 connected between a second floating-regulator 38 and the first charge-transfer path 24 at the first node N1A. The second floating-regulator 38 includes a second regulator switch 40 that regulates the flow of this charge into the second driver 36 and a Zener diode 42 connected to maintain a relatively constant gate voltage across the second driver 36.

The second floating-regulator 38 receives current from either the second node N2B or the fourth node N1B. Therefore, like the first floating-regulator 30, the second floating-regulator 38 is cross-coupled between the first and second charge-transfer paths 24, 26. The structure and operation of the second floating-regulator 38 is similar to that already discussed in connection with the first floating-regulator 30.

Like the first floating-regulator 30, the second floating-regulator 38 features a second-regulator shunt TM2. During normal operation of the switched-capacitor network 8, the second-regulator shunt TM2 remains non-conducting. As a result, current for biasing the second regulator switch 40 flows into the first charge-transfer path 24 and joins whatever current is already there. At some time during testing, the second-regulator shunt TM2 will be made to conduct. This causes this current to pass to ground instead of to the first charge-transfer path 24. Once testing is complete, the second-regulator shunt TM2 is expected to never be used again.

The output node OUT_INT supplies current directly to a third driver 44 for charging the third switch's gate. When the third driver 44 does not need current, this current goes to a third floating-regulator 46. Additionally, when the third driver 44 removes current from the third switch's gate, that current also goes to the third floating-regulator 46.

In either case, the third floating-regulator 46 recycles the charge in this current by passing it to either the second node N2B or to the fourth node N1B through which it ultimately reaches a capacitor C2, C4. Therefore, like the first floating-regulator 30, the third floating-regulator 38 is cross-coupled between the first and second charge-transfer paths 24, 26.

The operation of the third floating-regulator 46 is slightly different from that of the first and second regulators 30, 38 because the third switch 16 is implemented as a PMOS transistor.

Like the first floating-regulator 30, the third floating-regulator 46 includes a Zener diode 47 in series with a resistor R3. The Zener diode again functions as a voltage source that supplies a voltage equal to the third switch's source voltage with a fixed offset. Since this Zener diode is in parallel with the third driver 44, this voltage ensures placement of the correct amount of charge on the third switch's gate to close the switch.

Also, like the first floating-regulator 30, the third floating-regulator 46 includes first and second diodes D4, D5. However, instead of supplying charge from capacitors, these diodes D4, D5 supply charge to capacitors. The first diode D4 supplies charge to a capacitor connected to the fourth node N1B and the second diode D5 supplies charge to a capacitor connected to the second node N2B. The charge in both cases comes from the third driver 44.

The third floating-regulator 46 features a third-regulator shunt TM1. During normal operation of the switched-capacitor network 8, the third-regulator shunt TM1 remains non-conducting. As a result, current that enters the third floating-regulator 46 ultimately drains to either the second node N2B or to the fourth node N1B and into one of the first and second transfer-paths 24, 26. At some time during testing, the third-regulator shunt TM1 will be made to conduct, thus shunting current to ground instead of to one of the first and second charge-transfer paths 24, 26.

The switching circuit 10 also has drivers and regulators for the switches in the second transfer path 26. These are mirror images of the corresponding strictures along the first charge-transfer path 24. Accordingly, descriptions thereof are omitted to avoid prolixity.

Figure 9:
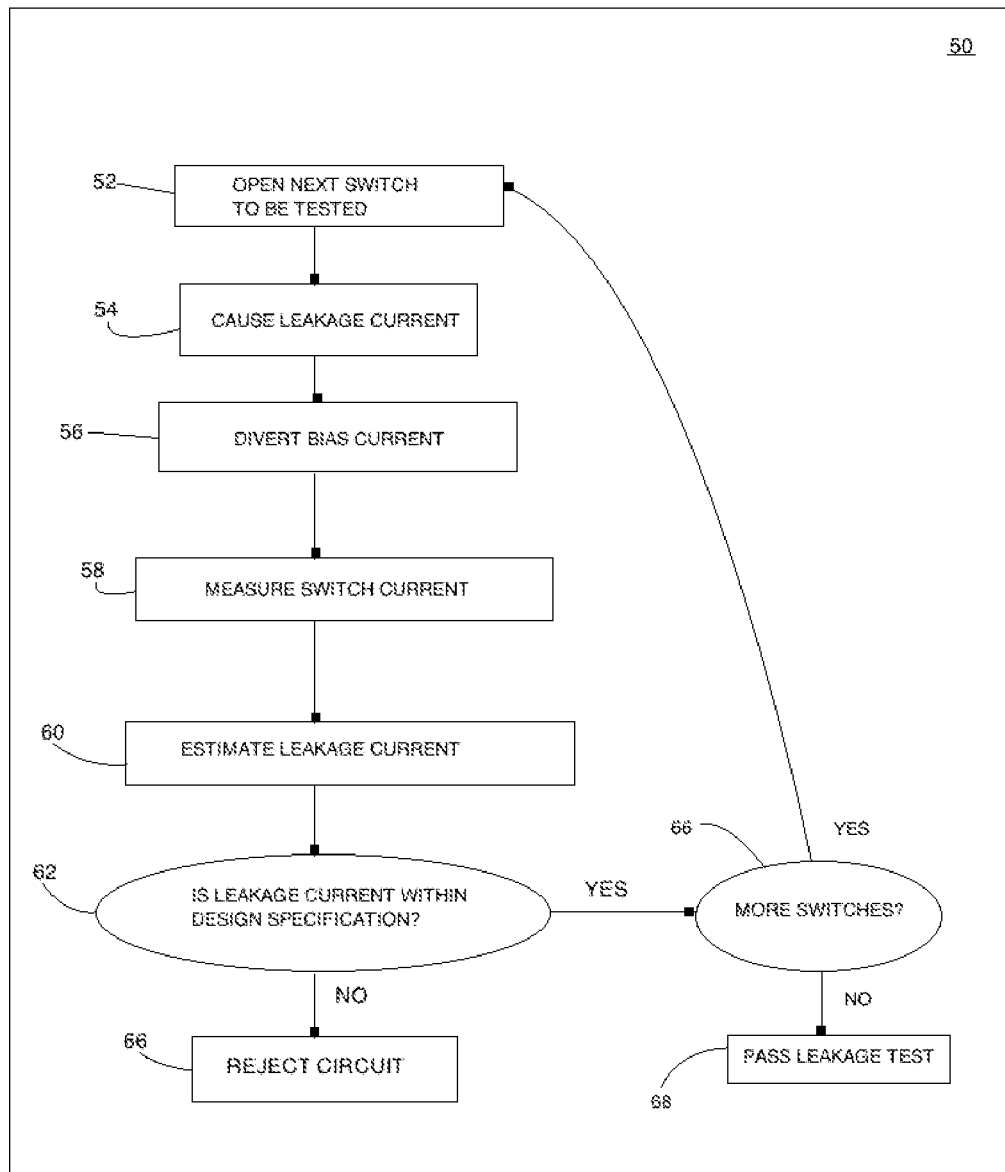
FIG. 9 shows steps for testing leakage current.
Figure 10:
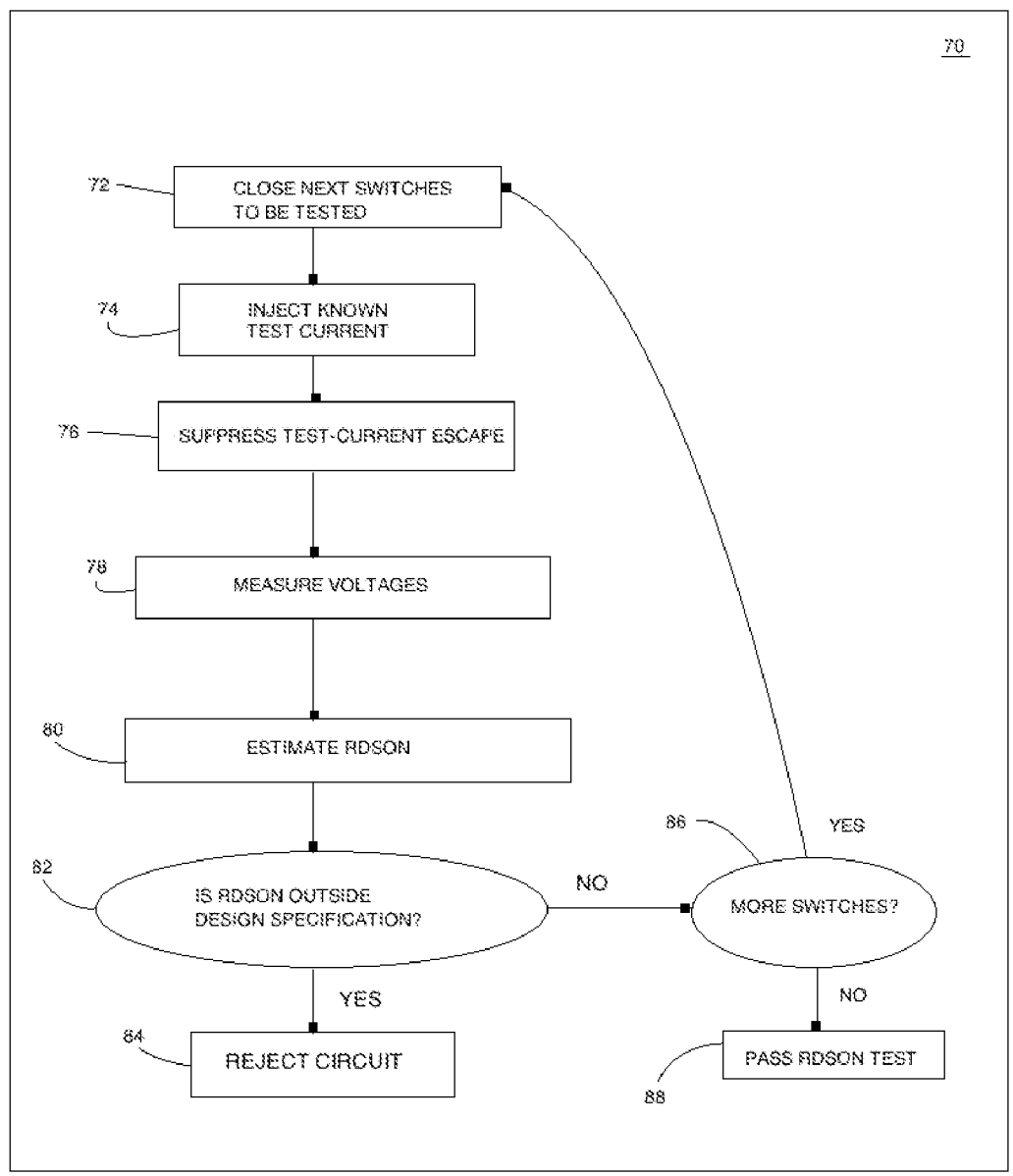
FIG. 10 shows steps for testing RDSON.

After having manufactured the switching circuit 10, it is desirable to test one or more switches to confirm that those switches meet design specifications for both leakage current and RDSON. FIGS. 9 and 10 shows methods for doing so.

Figure 3:
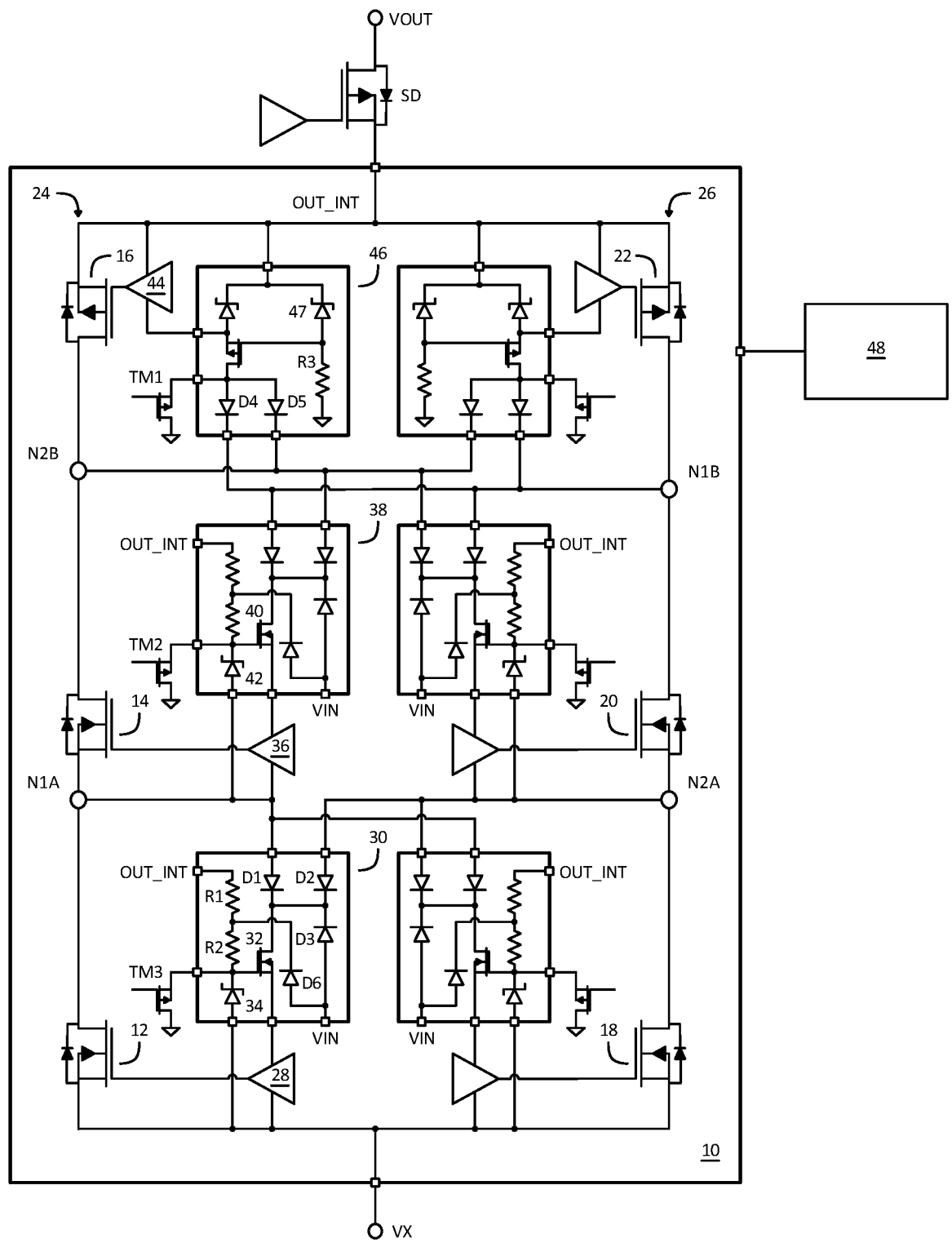
FIG. 3 shows the switch circuit of FIG. 2 configured for testing.

Part of manufacturing the switching circuit 10 is to test the leakage current and RDSON of each switch 12, 14, 16, 18, 29, 22. This includes connecting the switching circuit 10 to a test controller 48 as shown in FIG. 3.

Figure 4:
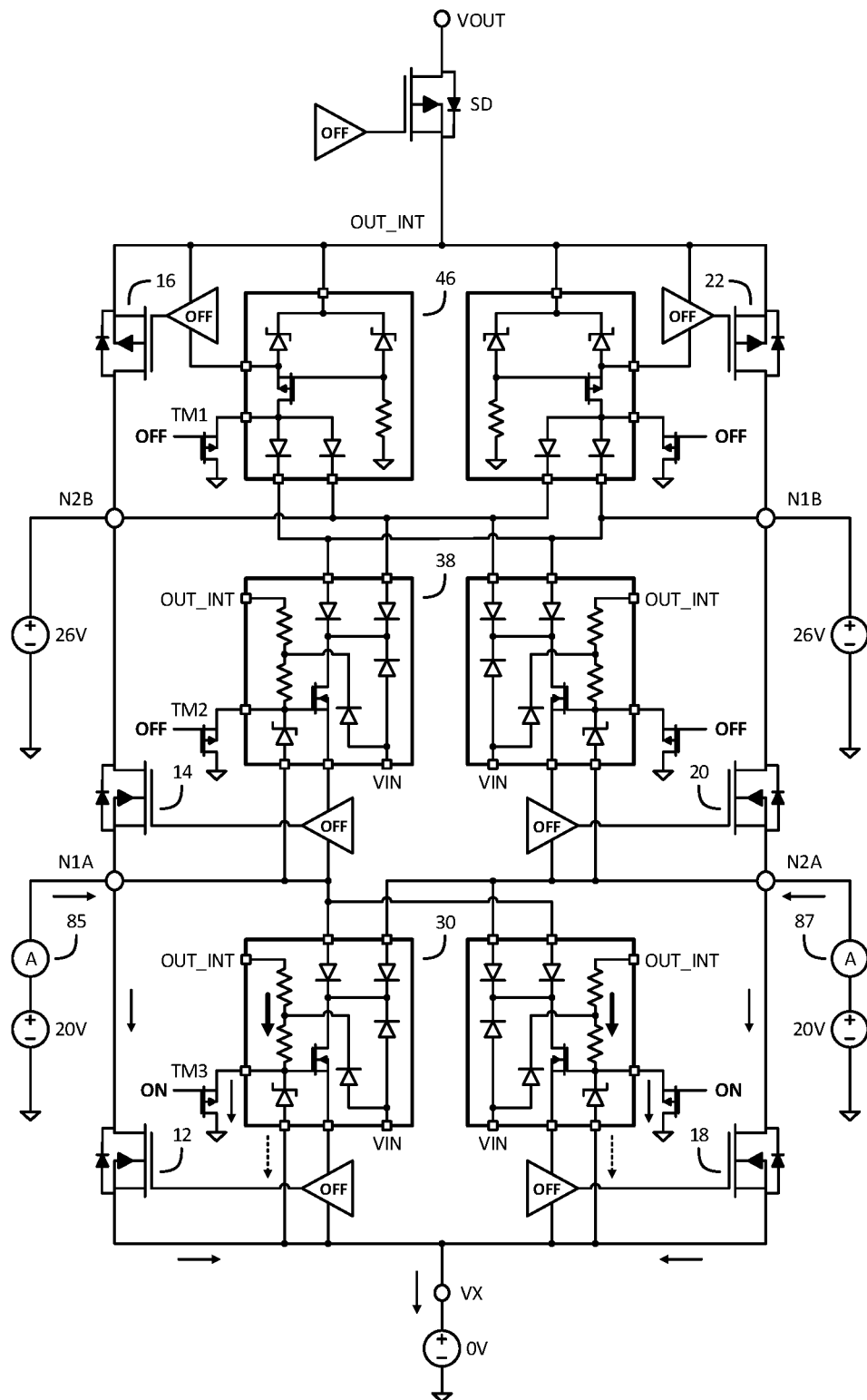
FIG. 4 shows the switched-capacitor network shown in FIG. 2 configured to test leakage current across a first pair of switches.

Referring first to FIG. 4, to test the leakage current of the first switch 12, the test controller 48 opens the first switch 12.

As can be seen in FIG. 4, the first floating-regulator 30 receives current from the output node OUT_INT. In normal operation, this current would exit the first floating-regulator 30 and return to a node of lower potential via the first charge-transfer path 24. However, because the leakage current will also be flowing through the first charge-transfer path 24, this extra current will pollute the measurement of leakage current. To prevent pollution of the measurement by this extra current, the test controller 48 closes the first-regulator shunt TM3. This enables current leaving the first floating-regulator 30 to bypass the first charge-transfer path 24 on its way to a node of lower potential. As a result, the only current that will flow through the first charge-transfer path 24 will be the leakage current that is to be measured.

The test controller 48 connects a current meter 85 between a voltage source and the first node N1A. The voltage source then applies a voltage at the drain of the first switch 12. Since the source of the first switch 12 is grounded by that test controller 48, a test voltage develops across the first switch's drain and source terminals. The test voltage is selected based upon the voltage rating of the switch under test.

In response to this applied voltage, a leakage current flows through the opened first switch 12. This leakage current draws current through the current meter 85 towards the first node N1A. To the extent this current all flows along the first charge-transfer path 24 toward the first switch 12, it is equal to the leakage current.

However, one cannot take it for granted that all current passing through the current meter 85 will be leakage current. It is apparent from inspecting the circuit's topology that when current reaches the first node N1A, it will have three choices on where to go next, only one of which is in the direction of the first switch 12.

To obtain an accurate measurement, it is important that, upon reaching the first node N1A, all of this current be directed toward the first switch 12. This is carried out by placing various impediments to current flowing through any path but the desired path.

The most significant alternative path is through the second switch 14. Thus, the test controller 48 opens the second switch 14 to discourage current entering the first node N1A from going through the second switch 14.

However, this is not enough. The second switch 14 is a MOSFET. Therefore, has an inherent body diode. The orientation of this body diode's cathode and anode creates the possibility that current entering the first node N1A will flow through the body diode instead of through the first switch.

To suppress this possibility, the test controller 48 also applies a voltage at the drain of the second switch 14. This biases the body diode and thus discourages entry of current that enters the first node N1A, thereby encouraging all current entering the first node N1A to pass through the first switch 12. As a result, when the current meter 85 reports its measurement, that measurement will indeed reflect the leakage current and not the sum of the leakage current and some other current that ultimately went elsewhere.

As shown, the voltage applied at the second node N2B is 26 volts and the voltage applied at the first node N1A is 20 volts, thus leading to a six-volt bias across the second switch 14. For those cases in which the switches are implemented as MOSFETs, it would also be possible to apply 20 volts at the second node N2B in which case the net applied voltage across the second switch 14 would be zero. This would still suppress current flow through the second switch 14 because would have an intrinsic body diode that would block current flow driven until the voltage driving that current flow increases beyond the potential barrier imposed by that body diode's space-charge layer.

The remaining alternative path is one that leads to the first floating-regulator 30 and a fourth floating-regulator connected to the fourth switch 18. However, it is apparent from inspection of the topology that this path will already be blocked because the first regulator switch 32 and a regulator switch in the fourth floating-regulator will have been opened.

FIG. 4 also shows the test controller 48 testing the leakage current of the fourth switch 18 at the same time. Such testing is carried out using the same methods used in connection with testing the leakage current of the first switch 12.

Figure 5:
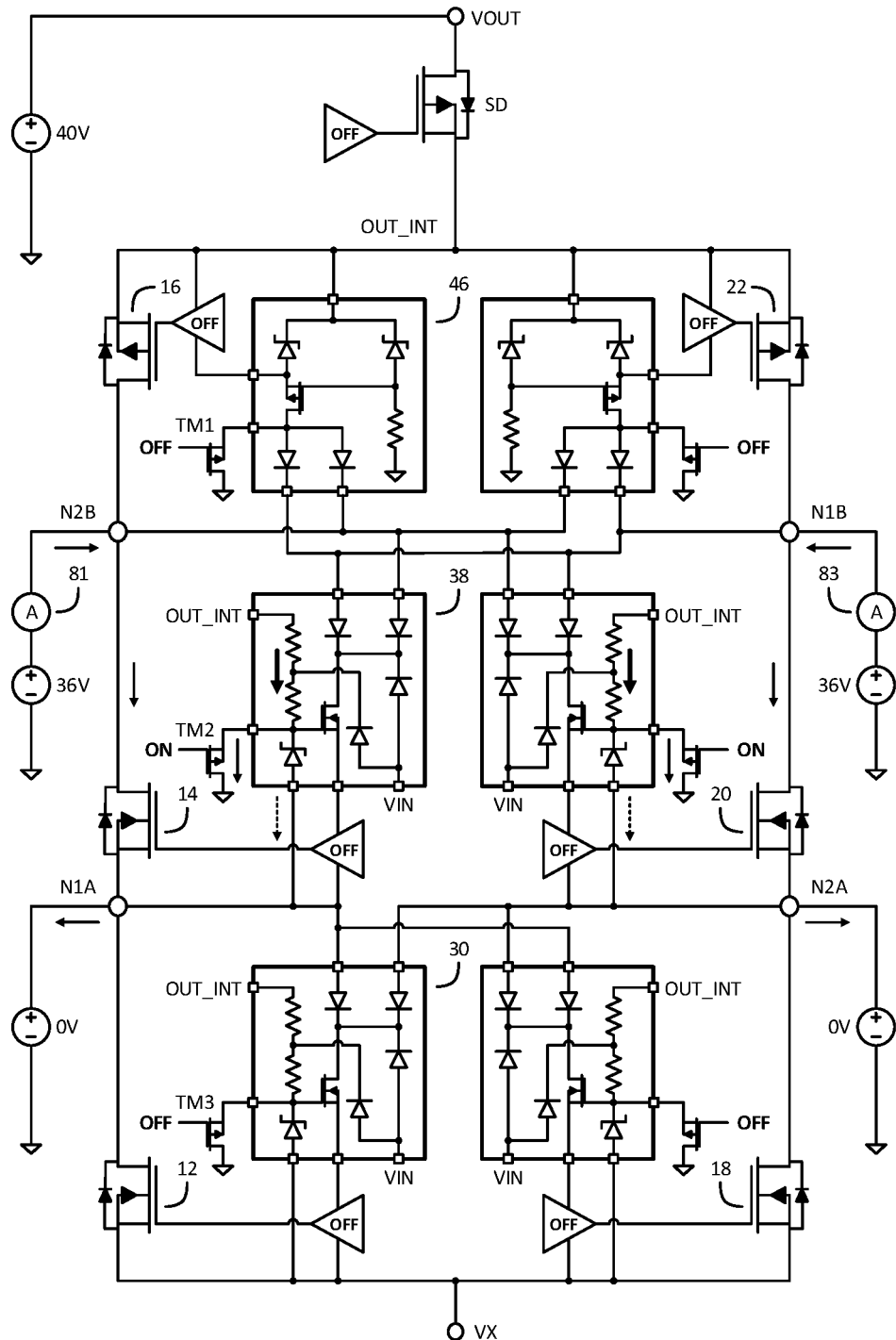
FIG. 5 shows the switched-capacitor network shown in FIG. 2 configured to test leakage current across a second pair of switches.

FIG. 5 shows the test controller 48 concurrently testing the leakage currents at the second switch 14 and at the fifth switch 20. The same principles discussed in connection with the leakage current measurement of the first and fourth switches 12, 18 in FIG. 4 are used in the measurement shown in FIG. 5.

In FIG. 5, the test controller 48 closes the second-regulator shunt TM2 for the same reason it closed the first-regulator shunt TM3. The test controller 48 applies 40 volts to the drain voltage of the disconnect switch SD and 36 volts to the drain of the second switch 14. As a result, the net voltage across the source and drain terminals of the third switch 16 is four volts minus the body diode drop of the disconnect switch SD. This nevertheless discourages current flow through the body diode of the third switch 16 because the body diode's own space-charge layer will create a potential barrier to suppress such current flow.

Figure 6:
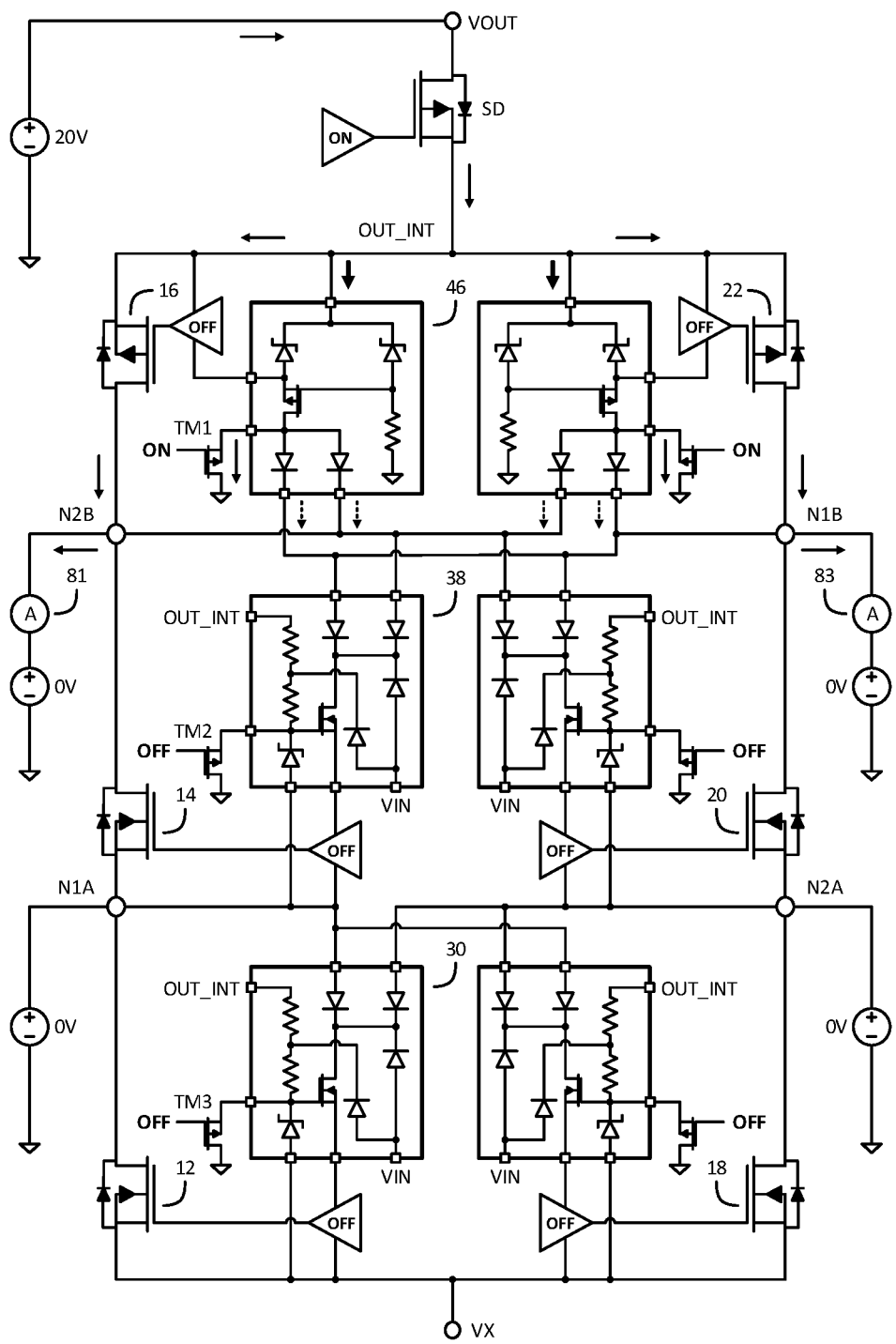
FIG. 6 shows the switched-capacitor network shown in FIG. 2 configured to test leakage current across a third pair of switches.

FIG. 6 shows the test controller 48 concurrently testing the leakage currents at the third switch 16 and at the sixth switch 22. The same principles discussed in connection with the leakage current measurement of the first and fourth switches 12, 18 in FIG. 4 are used in the measurement shown in FIG. 6.

In addition to measuring leakage current, the test controller 48 also measures RDSON for each switch 12-22.

Closing a switch 12-22 forms a conducting channel between the source and drain. It is through this channel that charge flows. However, this channel, being made from a semiconductor, has a non-negligible resistance. This resistance is RDSON. If RDSON is too high, energy will be lost through heating. As a result, it is important to confirm that the RDSON value is consistent with design specifications.

A useful way to measure RDSON is apply a suitable gate voltage so as to create the conducting channel, to inject a known current through this channel, and to then measure the voltage between the source terminal and the drain terminal. The ratio of this voltage measurement and the known current provides a way to determine RDSON.

This method is particularly useful for the circuit shown in FIG. 2 because each charge-transfer path 24, 26 passes through the conducting channels of three switches 12-16, 18-22. This makes it possible to inject one known current into the charge-transfer path 24, 26 and to then concurrently measure the voltages across three switches 12-16, 18-22.

Figure 7:
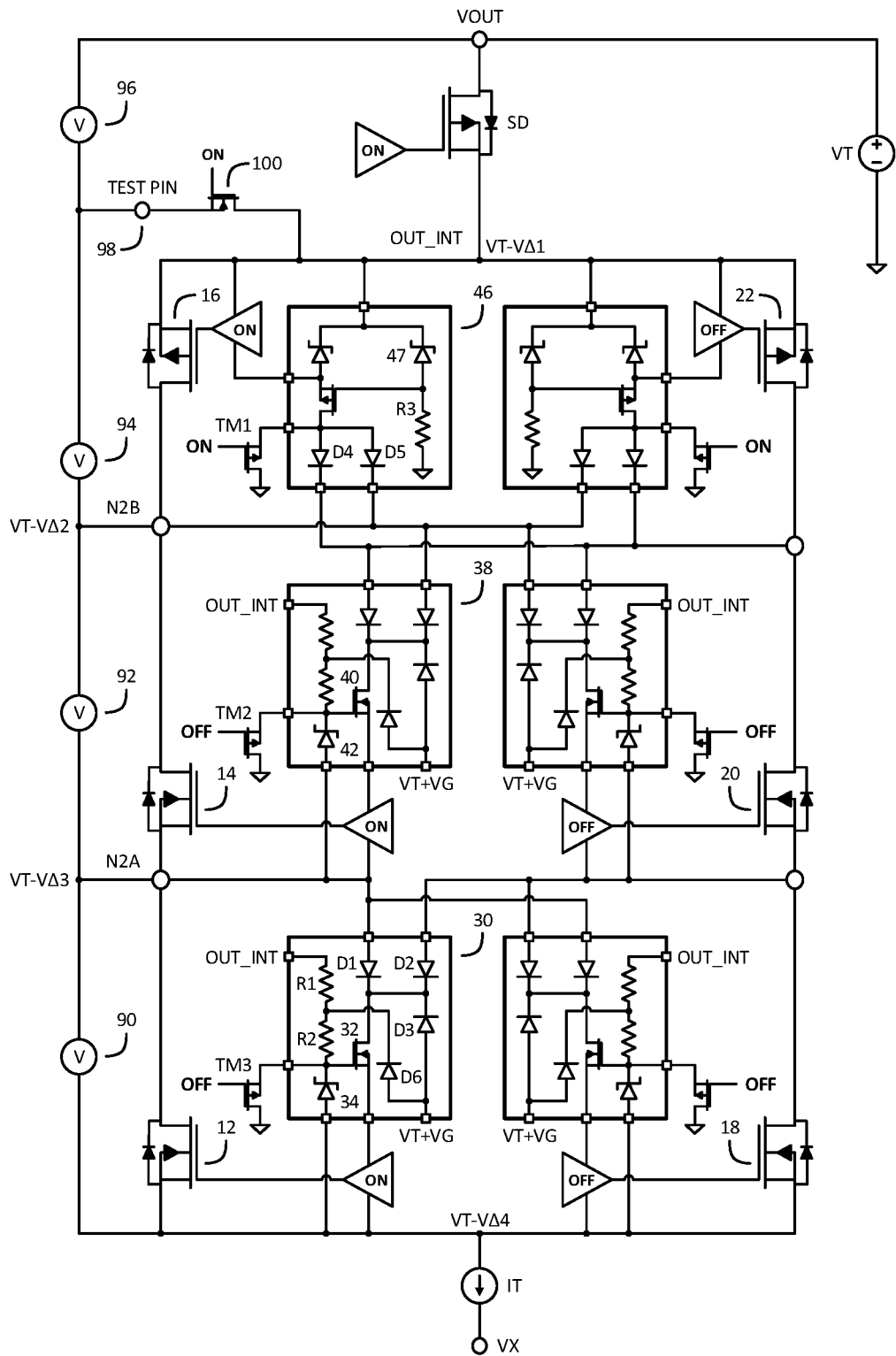
FIG. 7 shows the switched-capacitor network shown in FIG. 2 configured to measure RDSON of three of the six switches.

FIG. 7 shows the test controller 48 making an RDSON measurement for the switches 12-16 on the first charge-transfer path 24.

The test controller 48 closes all the switches 12-16 on the first charge-transfer path 24 and opens all the switches 18-22 on the second charge-transfer path 26. This ensures that the known current flows through only the first charge-transfer path 24. A bias voltage source VT connected to the output causes the source voltages of all the switches 12-16 on the first charge-transfer path 24 to be close a bias voltage VT. Because of this bias voltage, the voltage provided to the first and second regulators 30, 38 to provide power to their respective gate drivers 28, 36 is the bias voltage VT increased by the gate voltage VG required to close the relevant switch 12, 14, 16.

The test controller 48 then connects first, second, and third voltmeters 90, 92, 94 across the drain and source terminals of the first, second, and third switches 12, 14, 16 respectively.

The test controller 48 then connects a test current source IT so as to force a known current through the first charge-transfer path 24. As a result of this current, the bias voltage VT measured by the first voltmeter 90 will drop by a small amount V∆4−V∆3 as a result of the RDSON of the first switch 12. The second and third voltmeters 92, 94 will likewise measure small drops V∆3−V∆2 and V∆2−V∆1 caused by the RDSON values of the second and third switches 14, 16.

It is important that the current that actually flows through the first charge-transfer path 24 in fact be equal to the current provided by the current source IT. This means that no current should enter or leave the first charge-transfer path 24.

When measuring leakage current, the most significant source of inaccuracy arose from current that was being used to bias the floating-regulators. These currents would eventually find their way into first charge-transfer path 24. Once there, these currents would add to the leakage current that was already there. Since the leakage current was small, even this stray current was enough to taint the measurements of leakage current.

When measuring RDSON, the known current provided by the test current source IT is quite large. As such, the entry of stray currents used to bias the floating-regulators matters less. However, it is still possible for some of this test current to either stray away from the first charge-transfer path 24 or to fail to enter the first charge-transfer path 24 in the first place. In either case, the result is a poorer estimate of RDSON.

To ensure that all the test current at least enters the first charge-transfer path 24, it is useful to open all the switches that are on the second charge-transfer path 26, namely the fourth switch 18, the fifth switch 20, and the sixth switch 22.

Once the test current is on the first charge-transfer path 24, it is still possible for it to prematurely leave the path by entering one of the first and second floating-regulators 30, 38. To avoid this, it is useful to reverse bias the first and second diodes D1, D2 of each of the first and second floating-regulators 30, 38.

The process of reverse biasing includes applying, to the anode of the third diode D3 of each of the first and second floating-regulators 30, 38, a voltage that is in excess of the bias voltage VT. In the illustrated example, this excess over the bias voltage VT is selected to be the gate voltage VG. As a result, the applied gate voltage VG is doing two things at once: it is biasing a switch and also confining test current in the first charge-transfer path 24 by suitably biasing the first and second diodes D1, D2, thereby barring the entry of any test current into the first and second floating-regulators 30, 38.

Figure 8:
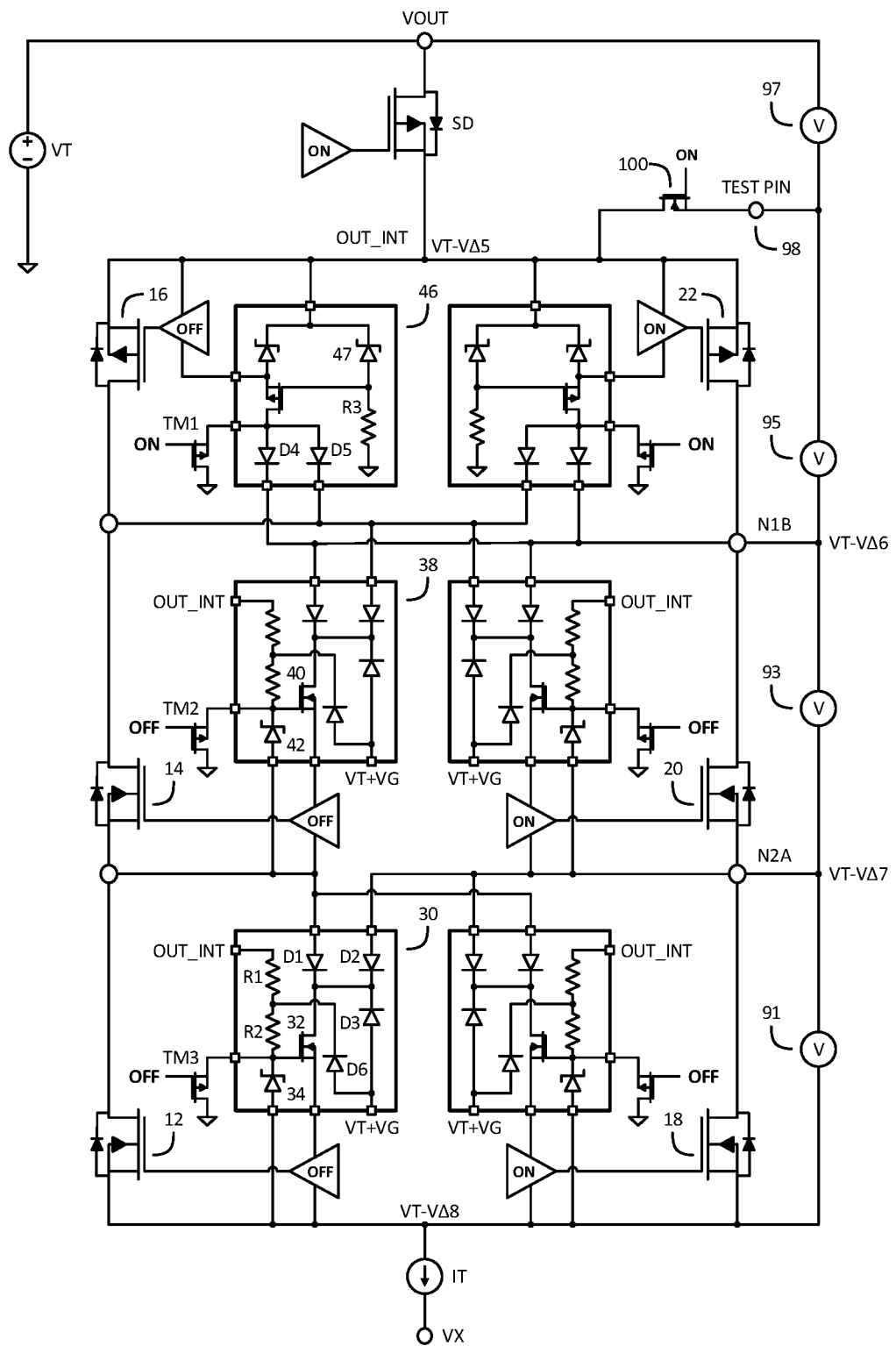
FIG. 8 shows the switched-capacitor network shown in FIG. 2 configured to measure RDSON of the remaining three of the six switches.

FIG. 8 shows the test controller 48 configured to measure RDSON for the switches 18, 20, 22 on the second charge-transfer path 26. The configuration is essentially the mirror image of that described in connection with the switches 12, 14, 16 on the first charge-transfer path 24.

In some cases, it is also useful to measure RDSON of the disconnect switch SD as well as the switches within the switching circuit 10. The test controller 48 carries this out by connecting a fourth voltmeter 96 between a testing pin 98 and the output of the switched-capacitor network 8 and then closing a testing switch 100 that couples the testing pin 98 to the output node OUT_INT of the switching circuit 10. This testing switch 100 remains open during normal operation and is only closed for this testing procedure. Closing the testing switch 100 places the fourth voltmeter's terminals on the drain and source of the disconnect switch SD.

The test controller 48 implements a method for testing switches.

The method described and claimed herein results in an improvement to a technological field, namely the field of testing semiconductor devices. To the extent the set of all such methods can be divided into abstract methods and non-abstract methods, the methods as described herein are only the non-abstract methods. Any descriptions of abstract methods have been specifically excluded from this specification. In addition, the methods described herein are only those that cannot be carried out by a human being using only a writing implement and paper. Thus, none of the methods described and claimed herein are purely mental steps.

FIG. 9 shows a non-abstract testing method 50 for estimating the leakage current through a switch 12.

The process begins by opening the switch 12 whose leakage current is to be estimated (step 52) and applying a known voltage across it. In response to this voltage, a small leakage current will flow through the switch 12 (step 54).

However, the process of controlling switches 12 itself requires current. These currents pass through the various floating-regulators and drivers that control the switches. Collectively, these currents will be referred to herein as "biasing current" to distinguish them from the "leakage current" that is of interest. In normal operation, these biasing currents ultimately make their way to the same path that goes through the switch 12.

Given the relative magnitudes of the biasing current and the leakage current that is to be measured, it is important that this current not be allowed to mix with the leakage current. Otherwise, the estimate of leakage current will be degraded.

To maintain the purity of the leakage current, the method includes the step of diverting the biasing current so that it does not mix with the leakage current that is to be measured (step 56). Typically, the biasing current is simply diverted to ground. One way to do so is to close corresponding shunts TM1, TM2, TM3. In either case, as a result of this diversion, the biasing current will not mix with the leakage current.

The process then continues with measuring the current through the switch (step 58). One way to do this is to place a current sensor along that current path to sense the amount of this leakage current.

Because the current through the switch is now uncontaminated by current from any other source, it provides a basis for estimating the leakage current (step 60). The method then proceeds with determining whether the estimate of leakage current is within a design specification (step 62). If it is not, then the switching network is rejected (step 64). Otherwise, the process determines if there are more switches to test (step 66) and if so, proceeds to test the next switch (step 52). Otherwise, the circuit is passed (step 68).

FIG. 10 shows a process 70 for estimating the RDSON of several switches 12, 14, 16 at the same time.

This process begins by closing the switches 12, 14, 16 that are to be tested (step 72) and causing a known test current to enter a first charge-transfer path 24 that passes through all of the switches 12, 14, 16 (step 74). The process also includes taking steps to prevent that test current from escaping the first charge-transfer path 24 until it has passed through every switch 12, 14, 16 (step 76).

The testing current that enters the first charge-transfer path 24 is prone to escaping by passing through floating-regulators that are used to drive the switches. One way to suppress such escape is to prevent entry of any portion of the testing current into a floating-regulator. This can be carried out by applying a voltage that reverse biases a diode that would otherwise admit current into the floating-regulator. This applied voltage that biases this diode can also be used in connection with driving the switch.

The voltages across the switches 12, 14, 16 can then be measured at the same time or at essentially the same time (step 78). Based on these measured voltages and the known current, it is possible to estimate the RDSON of each switch 12, 14, 16 (step 80). This is typically carried out by dividing the measured voltage by the known value of current. The quotient that results from dividing this measured voltage by the known current is an estimate of RDSON.

The process proceeds with comparing the voltages to a design specification (step 82). If any voltage is outside the design specification, the circuit is rejected (step 84). If not, the process determines if any more switches are to be tested. If there are none, the circuit is marked as having completed the RDSON test (step 86). Otherwise, the process continues with testing the next switches.

As used herein, a "controller" refers to a tangible piece of hardware that consumes electrical energy in the course of performing work that includes moving electrical charge. The controller is made of a combination of baryonic matter and leptons. The controller generates waste heat and thus warms its environment. The controller has mass and is not an intangible structure. Nor is the controller software per se.

In some implementations, a tangible and non-transitory computer-readable storage-medium includes a database representative of one or more components of the power converter 2. Among these are implementations in which the database includes data representative of a switching circuit 10 that has been optimized to promote low-loss operation of the switched-capacitor network 8.

As used herein, a computer-readable storage-medium includes any non-transitory storage media accessible by a computer during use to provide instructions and/or data to the computer. Examples of computer-readable storage-media include storage media such as magnetic disks, optical disks, and semiconductor memories. These are non-abstract structures that are made of matter having interacting baryons and leptons.

In particular embodiments, a database representative of the system is a database or other data structure that is readable by a program and used, directly or indirectly, to fabricate the hardware comprising the system. The database is manifested in the real world by rearrangements of certain attributes of matter such as charge and direction of spin.

One example of such a database is a behavioral-level description or register-transfer level (RTL) description of the hardware functionality in a high-level design language (HDL) such as Verilog or VHDL. The description may be read by a synthesis tool that may synthesize the description to produce a netlist comprising a list of gates from a synthesis library. The netlist comprises a set of gates that also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, alternatively, the database may itself be the netlist, with or without the synthesis library, or the data set.

Various features, aspects, and embodiments of switched-capacitor power-converters have been described herein. The features, aspects, and numerous embodiments described are susceptible to combination with one another as well as to variation and modification, as will be understood by those having ordinary skill in the art. The present disclosure should, therefore, be considered to encompass such combinations, variations, and modifications.

Additionally, the terms and expressions that have been employed herein are used as terms of description and not of limitation. There is no intention, in the use of such terms and expressions, of excluding any equivalents of the features shown and described, or portions thereof. It is recognized that various modifications are possible within the scope of Having described the invention and embodiments thereof, what is claimed as new and secured by Letters Patent is:

1. An apparatus comprising a switching network, wherein the switching network, while connected to a plurality of capacitors, forms a switched-capacitor network, the switched-capacitor network is to transform a first voltage into a second voltage, wherein the switching network comprises a switch, a driver, and a floating-regulator, wherein the switch connects to a floating voltage, wherein the driver is configured to drive the switch using a drive voltage, wherein the floating-regulator is configured to rely on a voltage provided by an external voltage source for causing the drive voltage to be at a fixed offset from the floating voltage, and wherein the external voltage source is external to the switched-capacitor network, wherein the floating-regulator comprises a first terminal and a first output, wherein the first terminal is maintained at a voltage that depends on the floating voltage, and wherein the first output is maintained at a voltage that depends on the fixed offset, wherein the driver is connected between the first terminal and the first output.

2. The apparatus of claim 1, wherein the floating-regulator comprises a first path that connects a voltage provided by the external voltage source to the driver and a second path that connects a voltage corresponding to the fixed offset to the driver.

3. The apparatus of claim 1, wherein the floating-regulator comprises a regulator switch disposed along a first path, the first path connecting a voltage provided by a voltage source that is external voltage to the driver via and a Zener diode disposed along a second path, the second path connecting a voltage corresponding to the fixed offset to the driver.

4. The apparatus of claim 1, further comprising a controller configured to cause a bias current to hold the switch in a conducting state, to divert the bias current so that the bias current avoids interfering with a known current that is injected through the switch, to cause injection of the known current through the switch, to measure a voltage across the switch, and to estimate an RDSON of the switch conducts based on the measurement of the voltage and the known current.

5. The apparatus of claim 1, wherein the switch is one of a first plurality of switches that are arranged in series to define a first charge-transfer path that extends from an input of the switching network to an output of the switching network, wherein the first charge-transfer path comprises nodes at which switches from the first plurality of switches connect, and wherein the nodes are configured to be connected to the plurality of capacitors.

6. A method comprising:
estimating an RDSON value for a switch that, along with a driver that drives the switch and a floating-regulator for controlling the driver, is a constituent of a switching network that while connected to a plurality of capacitors, forms a switched-capacitor network, the switched-capacitor network is formed for transforming a first voltage into a second voltage, wherein the switch is disposed along a charge-transfer path, wherein the switch connects to a floating voltage, wherein estimating RDSON values comprises causing a known current to flow through the charge-transfer path and estimating an RDSON value for the switch;

wherein the floating-regulator comprises a first terminal and a first output, wherein the first terminal is maintained at a voltage that depends on the floating voltage, and wherein the first output is maintained at a voltage that depends on a fixed offset from the floating voltage, wherein the driver is connected between the first terminal and the first output.

7. The method of claim 6, wherein the switch is one of a plurality of switches in series along the charge-transfer path and the method comprises concurrently obtaining voltage measurements across each of the switches and estimating the RDSON values based on the voltage measurements.

8. The method of claim 6, wherein causing a known current to flow through the charge-transfer path comprises inhibiting opportunities for the current to stray from the charge-transfer path.

9. An apparatus comprising a switching network, wherein the switching network, while connected to a plurality of capacitors, forms a switched-capacitor network, the switched-capacitor network is to transform a first voltage into a second voltage, wherein the switching network comprises a switch, a driver, and a floating-regulator, wherein the switch connects to a floating voltage, wherein the driver is configured to drive the switch using a drive voltage, wherein the floating-regulator is configured to rely on a voltage provided by an external voltage source for causing the drive voltage to be at a fixed offset from the floating voltage, and wherein the external voltage source is external to the switched-capacitor network, wherein the floating-regulator comprises a regulator switch disposed along a first path, the first path connecting a voltage provided by a voltage source that is external voltage to the driver via and a Zener diode disposed along a second path, the second path connecting a voltage corresponding to the fixed offset to the driver.

10. An apparatus comprising a switching network and a controller, wherein the switching network, while connected to a plurality of capacitors, forms a switched-capacitor network, the switched-capacitor network is to transform a first voltage into a second voltage, wherein the switching network comprises a switch, a driver, and a floating-regulator, wherein the switch connects to a floating voltage, wherein the driver is configured to drive the switch using a drive voltage, wherein the floating-regulator is configured to rely on a voltage provided by an external voltage source for causing the drive voltage to be at a fixed offset from the floating voltage, and wherein the external voltage source is external to the switched-capacitor network, wherein the controller is configured to cause a bias current to hold the switch in a conducting state, to divert the bias current so that the bias current avoids interfering with a known current that is injected through the switch, to cause injection of the known current through the switch, to measure a voltage across the switch, and to estimate an RDSON of the switch conducts based on the measurement of the voltage and the known current.

* * * * *